United States Patent
Lee et al.

(10) Patent No.: US 11,310,402 B2
(45) Date of Patent: *Apr. 19, 2022

(54) IMAGE CAPTURING DEVICE AND FINGERPRINT IMAGE CAPTURING DEVICE

(71) Applicant: Gingy Technology Inc., Hsinchu (TW)

(72) Inventors: Wen-Chen Lee, Hsinchu (TW); Chiung-Han Wang, Hsinchu (TW); Jen-Chieh Wu, Hsinchu (TW)

(73) Assignee: Gingy Technology Inc., Hsinchu (TW)

( * ) Notice: Subject to any disclaimer, the term of this patent is extended or adjusted under 35 U.S.C. 154(b) by 287 days.

This patent is subject to a terminal disclaimer.

(21) Appl. No.: 16/571,207

(22) Filed: Sep. 16, 2019

(65) Prior Publication Data

US 2020/0059578 A1     Feb. 20, 2020

Related U.S. Application Data

(63) Continuation-in-part of application No. 16/008,037, filed on Jun. 14, 2018, now Pat. No. 10,460,188, which is a continuation-in-part of application No. 16/004,459, filed on Jun. 11, 2018, now abandoned, and a continuation-in-part of application No. 15/989,123, filed on May 24, 2018, now Pat. No. 10,181,069, and a continuation-in-part of application (Continued)

(30) Foreign Application Priority Data

Apr. 18, 2019  (CN) .......................... 201920526854.1

(51) Int. Cl.
*H04N 5/225*     (2006.01)
*G06K 9/00*      (2022.01)

(52) U.S. Cl.
CPC ....... *H04N 5/2253* (2013.01); *G06K 9/00013* (2013.01)

(58) Field of Classification Search
CPC ............ H04N 5/2253; G06K 9/00013; G06K 9/00885; G06K 9/00892; G06K 9/0004; G06K 9/00046; G02B 27/30; G02B 27/0988; G03B 11/00; A61B 5/1172; H01L 27/14623; H01L 27/14627; H01L 27/14629; H01L 27/14678
See application file for complete search history.

(56) References Cited

U.S. PATENT DOCUMENTS 8,304,923 B2 * 11/2012 Hu ...................... H01L 21/6835
                                                           257/787
8,411,197 B2 *  4/2013 Watanabe ......... H01L 27/14627
                                                           348/374
(Continued)

*Primary Examiner* — Manav Seth
(74) *Attorney, Agent, or Firm* — JCIPRNET

(57) ABSTRACT

An image capturing device including a cover plate, an image capturing module, a frame body, a first adhesive layer, and a second adhesive layer is provided. The frame body and the image capturing module are located on the same side of the cover plate. The frame body is joined to the cover plate through the first adhesive layer. The image capturing module is joined to the frame body through the second adhesive layer. An orthographic projection of the second adhesive layer on the cover plate falls within an orthographic projection of the frame body on the cover plate.

19 Claims, 5 Drawing Sheets

Related U.S. Application Data

No. 15/976,883, filed on May 11, 2018, now Pat. No. 10,091,402, and a continuation-in-part of application No. 15/956,875, filed on Apr. 19, 2018, now Pat. No. 10,713,465, and a continuation-in-part of application No. 15/942,386, filed on Mar. 30, 2018, now Pat. No. 10,122,899, which is a continuation-in-part of application No. 15/826,711, filed on Nov. 30, 2017, now Pat. No. 9,964,436, said application No. 16/008,037 is a continuation-in-part of application No. 15/719,575, filed on Sep. 29, 2017, now Pat. No. 10,713,521, said application No. 15/956,875 is a continuation-in-part of application No. 15/719,575, filed on Sep. 29, 2017, now Pat. No. 10,713,521, said application No. 16/008,037 is a continuation-in-part of application No. 15/713,693, filed on Sep. 24, 2017, now Pat. No. 10,043,847, said application No. 15/956,875 is a continuation-in-part of application No. 15/588,700, filed on May 8, 2017, now Pat. No. 10,455,129, said application No. 15/719,575 is a continuation-in-part of application No. 15/588,700, filed on May 8, 2017, now Pat. No. 10,455,129, said application No. 15/956,875 is a continuation-in-part of application No. 15/399,704, filed on Jan. 5, 2017, now Pat. No. 10,356,296, said application No. 15/719,575 is a continuation-in-part of application No. 15/399,704, filed on Jan. 5, 2017, now Pat. No. 10,356,296, said application No. 15/826,711 is a continuation-in-part of application No. 15/239,842, filed on Aug. 18, 2016, now Pat. No. 10,049,256, said application No. 16/004,459 is a continuation-in-part of application No. 15/239,842, filed on Aug. 18, 2016, now Pat. No. 10,049,256, said application No. 15/989,123 is a continuation-in-part of application No. 15/239,842, filed on Aug. 18, 2016, now Pat. No. 10,049,256, said application No. 15/976,883 is a continuation-in-part of application No. 15/239,842, filed on Aug. 18, 2016, now Pat. No. 10,049,256, said application No. 15/713,693 is a continuation-in-part of application No. 15/208,619, filed on Jul. 13, 2016, now Pat. No. 9,977,947, which is a continuation-in-part of application No. 14/978,237, filed on Dec. 22, 2015, now Pat. No. 9,770,199, and a continuation-in-part of application No. 14/835,130, filed on Aug. 25, 2015, now abandoned.

(60) Provisional application No. 62/784,755, filed on Dec. 25, 2018, provisional application No. 62/620,985, filed on Jan. 23, 2018, provisional application No. 62/574,222, filed on Oct. 19, 2017, provisional application No. 62/563,045, filed on Sep. 25, 2017, provisional application No. 62/533,632, filed on Jul. 17, 2017, provisional application No. 62/486,954, filed on Apr. 18, 2017, provisional application No. 62/413,974, filed on Oct. 27, 2016, provisional application No. 62/371,230, filed on Aug. 5, 2016, provisional application No. 62/266,002, filed on Dec. 11, 2015.

(56) References Cited

U.S. PATENT DOCUMENTS

| | | | |
|---|---|---|---|
| 9,502,455 B2* | 11/2016 | Akahoshi | H01L 24/19 |
| 9,811,710 B2* | 11/2017 | Gao | G06K 9/0004 |
| 9,811,711 B2* | 11/2017 | Huang | G06K 9/00046 |
| 9,964,436 B1* | 5/2018 | Chung | G01J 1/4228 |
| 10,043,847 B2* | 8/2018 | You | G06K 9/0004 |
| 10,102,411 B2* | 10/2018 | Lillie | G06F 3/0416 |
| 10,169,630 B2* | 1/2019 | Fomani | G01J 1/0233 |
| 10,176,355 B2* | 1/2019 | Smith | G06K 9/00013 |
| 10,181,070 B2* | 1/2019 | Smith | G06K 9/0004 |
| 10,303,921 B1* | 5/2019 | He | G02F 1/13318 |
| 10,312,276 B2* | 6/2019 | Chien | H01L 27/14623 |
| 10,340,250 B2* | 7/2019 | Chen | H04N 5/2253 |
| 10,489,631 B2* | 11/2019 | Lin | G06K 9/209 |
| 10,515,252 B2* | 12/2019 | Wu | G01J 1/0204 |
| 10,867,198 B2* | 12/2020 | Chung | G06K 9/00046 |
| 10,936,846 B2* | 3/2021 | Ling | A61B 5/1172 |
| 11,023,700 B2* | 6/2021 | Kurasawa | G06F 3/0445 |
| 11,062,117 B2* | 7/2021 | Liu | G06K 9/0002 |
| 11,073,712 B2* | 7/2021 | Yeke Yazdandoost | H01L 51/5284 |
| 2003/0042424 A1* | 3/2003 | Eberhard | G01T 1/2002 250/370.11 |
| 2009/0284628 A1* | 11/2009 | Wu | H01L 27/14618 348/294 |
| 2012/0273908 A1* | 11/2012 | Kinsman | H01L 27/14634 257/432 |
| 2016/0132712 A1* | 5/2016 | Yang | G06K 9/0002 348/77 |
| 2017/0364763 A1 | 12/2017 | Jin et al. | |
| 2018/0365472 A1 | 12/2018 | Cai | |
| 2021/0004558 A1* | 1/2021 | Zeng | H05K 1/0284 |

* cited by examiner

IMAGE CAPTURING DEVICE AND FINGERPRINT IMAGE CAPTURING DEVICE

CROSS-REFERENCE TO RELATED APPLICATION

This application is a continuation-in-part application of and claims the priority benefit of U.S. application Ser. No. 16/008,037, filed on Jun. 14, 2018, now allowed. This application also claims the priority benefits of U.S. provisional application Ser. No. 62/784,755, filed on Dec. 25, 2018 and China application serial no. 201920526854.1, filed on Apr. 18, 2019. The entirety of each of the above-mentioned patent applications is hereby incorporated by reference herein and made a part of this specification.

BACKGROUND

Technical Field

The disclosure relates to electronic devices, and more particularly to an image capturing device and a fingerprint image capturing device.

Description of Related Art

The types of biometric identification include face recognition, sound recognition, iris recognition, retina recognition, veins recognition, palm prints recognition, and fingerprint recognition. According to different sensing methods, biometric identification devices can be classified into optical, capacitive, ultrasonic and thermal sensing devices.

The optical biometric identification device mainly performs biometric identification by capturing an image of a biometric feature through an image capturing module. In a conventional optical biometric identification device, the image capturing module is adhered to a cover plate (or a display panel) through an adhesive layer, and said adhering is partial adhering rather than complete adhering. With this structure, in the area where the adhesive layer is provided, the light transmission medium between the cover plate and the image capturing module is the adhesive layer, and in the area where the adhesive layer is not provided, the light transmission medium between the cover plate and the image capturing module is not the adhesive layer (for example, air). Since different light transmission media have different refractive indices thereof, the user can easily perceive the appearance of the image capturing module when operating the biometric identification device.

SUMMARY

The disclosure provides an image capturing device, wherein the image capturing module is not easily perceived by the user.

An image capturing device of the exemplary embodiment of the disclosure includes a cover plate, an image capturing module, a frame body, a first adhesive layer and a second adhesive layer. The frame body and the image capturing module are located on the same side of the cover plate. The frame body is joined to the cover plate through the first adhesive layer. The image capturing module is joined to the frame body through the second adhesive layer. An orthographic projection of the second adhesive layer on the cover plate falls within an orthographic projection of the frame body on the cover plate.

A fingerprint image capturing device of the exemplary embodiment of the disclosure includes a cover plate, an image capturing module, a frame body, a first adhesive layer and a second adhesive layer. The frame body and the image capturing module are located on the same side of the cover plate. The frame body is joined to the cover plate through the first adhesive layer. The image capturing module is joined to the frame body through the second adhesive layer. An orthographic projection of the second adhesive layer on the cover plate falls within an orthographic projection of the frame body on the cover plate. The image capturing module includes a carrier, a sensor, a band pass filter component, a collimator and at least one supporting member. The sensor is disposed on the carrier. The band pass filter component is disposed on the sensor. The collimator is disposed on the band pass filter component. The at least one supporting member is disposed on the carrier and located at a periphery of the sensor.

According to the above, in the image capturing device and the fingerprint image capturing device of the exemplary embodiments of the disclosure, the frame body is adhered to the cover plate through the first adhesive layer, the image capturing module is adhered to the frame body through the second adhesive layer, and the orthographic projection of the second adhesive layer on the cover plate falls within the orthographic projection of the frame body on the cover plate. Therefore, when viewed from the side of the cover plate, the second adhesive layer is covered by the frame body. By hiding the second adhesive layer under the frame body, it is possible to prevent the second adhesive layer from affecting the visual effect. In addition, since the image capturing module is indirectly joined to the cover plate through the second adhesive layer, the frame body and the first adhesive layer, there is no need to provide an adhesive layer between the cover plate and the image capturing module not covered by the frame body. With such design, there may be only one light transmission medium (such as air) between the cover plate and the image capturing module not covered by the frame body, so the image capturing module is not easily perceived by the user.

In order to make the aforementioned features and advantages of the disclosure more comprehensible, embodiments accompanying figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the invention and, together with the description, serve to explain the principles of the disclosure.

DESCRIPTION OF THE EXEMPLARY EMBODIMENTS

Figure 1:
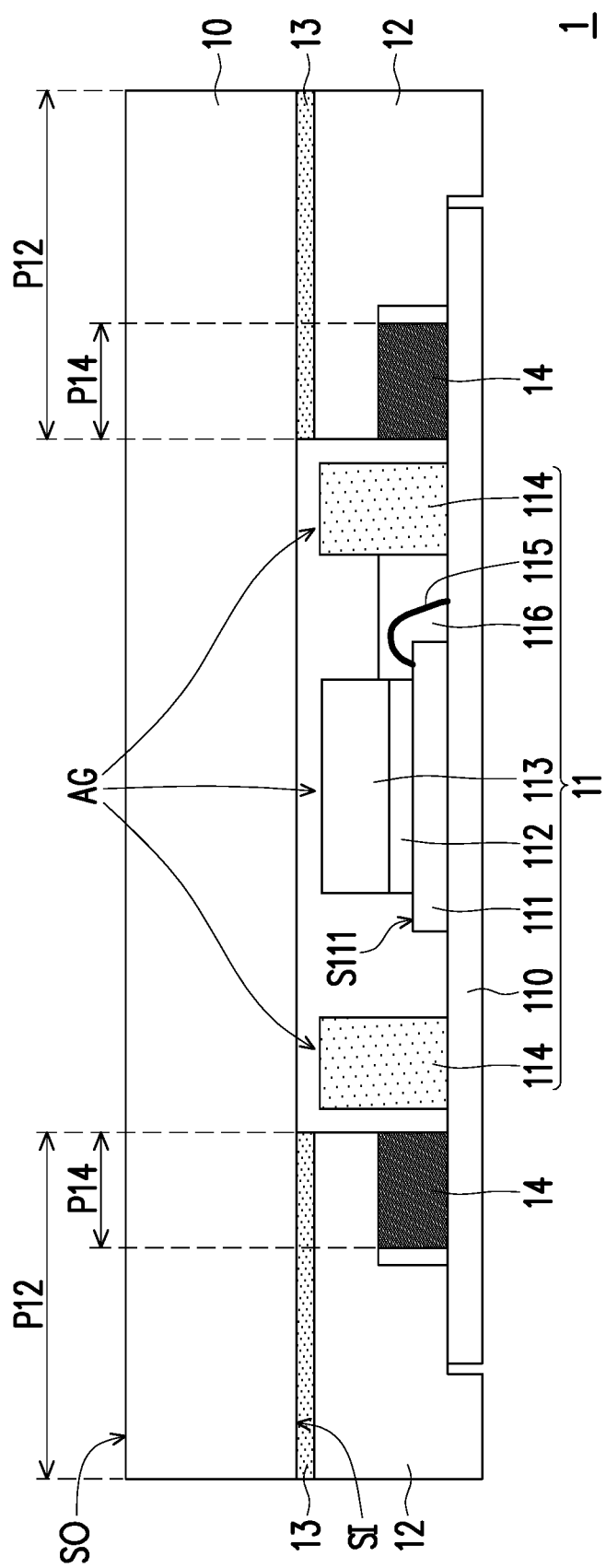
FIG. 1 to FIG. 5 are schematic cross-sectional views of an image capturing device according to the first to the fifth exemplary embodiments of the disclosure, respectively.

In the following embodiments, wordings used to indicate directions, such as "up," "down," "front," "back," "left," and "right," merely refer to directions in the accompanying drawings. Therefore, the directional wordings are used to illustrate rather than limit the disclosure. In the accompanying drawings, the drawings illustrate the general features of the methods, structures, and/or materials used in the particular exemplary embodiments. However, the drawings shall not be interpreted as defining or limiting the scope or nature covered by the exemplary embodiments. For example, the relative size, thickness and location of layers, regions, and/or structures may be reduced or enlarged for clarity.

In the exemplary embodiments, the same or similar elements will be designated by the same or similar reference numerals, and descriptions thereof will be omitted. In addition, the features of different exemplary embodiments may be combined with each other when they are not in conflict, and simple equivalent changes and modifications made according to the specification or the claims are still within the scope of the disclosure. In addition, the terms such as "first" and "second" mentioned in the specification or the claims are only used to name discrete elements or to distinguish different exemplary embodiments or scopes and are not intended to limit the upper or lower limit of the number of the elements, nor are they intended to limit the manufacturing order or disposition order of the elements.

FIG. 1 to FIG. 5 are schematic cross-sectional views of an image capturing device 1 to an image capturing device 5 according to the first to the fifth exemplary embodiments of the disclosure, respectively. Each of the image capturing devices 1 to 5 is adapted to capture biometric features of an object under test (not shown). For example, the object under test may be a finger, and the biometric feature may be a fingerprint or a vein, i.e., each of the image capturing devices 1 to 5 may be a fingerprint image capturing device or a vein image capturing device, but not limited thereto. In an exemplary embodiment, the object under test may be a palm, and the biometric feature may be a palm print i.e., each of the image capturing devices 1 to 5 may be a palm print image capturing device.

Referring to FIG. 1, the image capturing device 1 of the first exemplary embodiment includes a cover plate 10, an image capturing module 11, a frame body 12, a first adhesive layer 13, and a second adhesive layer 14.

The cover plate 10 may include a transparent cover plate, a display panel, a touch panel, or a combination of at least two of the above. When the cover plate 10 is a display panel, the image capturing device 1 can further have a display function. Moreover, a portion of the light beam emitted from the display panel may be used for image capturing. The display panel may be an organic light emitting display panel, but not limited thereto. Moreover, the display panel may be a rigid display panel or a flexible display panel. When the cover plate 10 is a transparent cover plate, the cover plate 10 can be configured to protect the components located underneath. For example, the transparent cover plate can be a glass cover plate or a plastic cover plate. The glass cover plate may be a chemically strengthened or physically strengthened glass substrate or a non-strengthened glass substrate. The plastic cover plate may be a substrate made of polycarbonate (PC), polyethylene terephthalate (PET), polymethylmethacrylate (PMMA) or polyimide (PI), but not limited thereto.

The cover plate 10 has an inner surface SI and an outer surface SO. The inner surface SI is a surface of the cover plate 10 facing the image capturing module 11. The outer surface SO is opposite to the inner surface SI, and the outer surface SO is a surface of the cover plate 10 facing the object under test. When performing biometric identification, the object under test is pressed on the outer surface SO. In other words, the outer surface SO is the pressing surface of the object under test. The cover plate 10 may be located at the top or bottom of an electronic device. When the cover plate 10 is located at the top of an electronic device, the outer surface SO faces the user and the cover plate 10 is located between the image capturing module 11 and the user when performing biometric identification. When the cover plate 10 is located at the bottom (back) of an electronic device (e.g. the cover plate 10 serves as a back plate of the electronic device), the outer surface SO faces away from the user and the image capturing module 11 is located between the cover plate 10 and the user when performing biometric identification. Namely, the object under test (e.g. a finger of the user) touches the back of the electronic device to perform biometric identification.

The image capturing module 11 faces the inner surface SI of the cover plate 10 and is disposed adjacent to the inner surface SI of the cover plate 10. The image capturing module 11 is configured to capture images of biometric features for biometric identification. In the exemplary embodiment, the image capturing module 11 can be any known optical biometric identification module. FIG. 1 schematically illustrates an exemplary embodiment of the image capturing module 11, wherein the image capturing module 11 includes a carrier 110, a sensor 111, a band pass filter component 112, a collimator 113, and at least one supporting member 114, but the implementation of the image capturing module 11 is not limited thereto.

The carrier 110 is configured to carry components such as the sensor 111, the band pass filter component 112, the collimator 113, and the supporting member 114 described above. In addition, the carrier 110 may further have circuitry to electrically connect the electronic components disposed thereon with external lines. For example, the carrier 110 may include a flexible printed circuit (FPC) or a printed circuit board (PCB). When the carrier 110 includes an FPC, the carrier 110 may further include a stiffener. That is, the carrier 110 may be a single layer plate or a composite plate.

The sensor 111 is disposed on the carrier 110. A sensing surface S111 of the sensor 111 faces the cover plate 10 to receive the light beam (light beam with biometric information) reflected by the object under test. For example, the sensor 111 may include a charge coupled device (CCD), a complementary metal-oxide semiconductor (CMOS) or other suitable kinds of image sensing components. In the exemplary embodiment, the image capturing module 11 further includes a wire 115 and an encapsulation layer 116. The sensor 111 is electrically connected to the circuit on the carrier 110 through the wire 115. The encapsulation layer 116 is disposed on the carrier 110 and covers the wire 115 to protect the wire 115.

The band pass filter component 112 is disposed on the sensor 111 to filter stray light and reduce the interference of stray light on biometric identification. For example, the band pass filter component 112 can be an infrared filter that filters infrared light and allows other light to pass through. However, the band filtered by the band pass filter component 112 can be changed as needed, and is not limited thereto.

The collimator 113 is disposed on the band pass filter component 112 to collimate the light beam transmitted toward the sensor 111. The collimator 113 may be any known collimating component, such as fibers, micro structures, micro lenses, or gratings, but is not limited thereto.

The supporting member 114 is disposed on the carrier 110 and located at the periphery of the sensor 111. When the object under test presses the outer surface SO of the cover plate 10, the cover plate 10 is pressed down. On this occasion, the supporting member 114 can support the cover plate 10 that is pressed down to prevent other components in the image capturing module 11 from being damaged. The shape of the supporting member 114 may be columnar or annular. When the shape of the supporting member 114 is a columnar shape, a plurality of supporting members 114 may be spaced apart and arranged at the periphery of the sensor 111. When the shape of the supporting member 114 is annular, the annular supporting member 114 can surround the sensor 111.

The frame body 12 and the image capturing module 11 are located on the same side of the cover plate 10, and the frame body 12 is disposed around the periphery of the image capturing module 11 to provide proper protection for the image capturing module 11. In addition, the frame body may be an opaque frame body to shield components that are not intended to be seen by the user.

The frame body 12 is joined to the cover plate 10 through the first adhesive layer 13. The first adhesive layer 13 may be an optical adhesive of the same color as the frame body 12, such as a dark-colored optical adhesive or a black optical adhesive, but is not limited thereto.

The image capturing module 11 is joined to the frame body 12 through the second adhesive layer 14. In other words, the image capturing module 11 is indirectly joined to the cover plate 10 through the second adhesive layer 14, the frame body 12, and the first adhesive layer 13.

The orthographic projection P14 of the second adhesive layer 14 on the cover plate 10 falls within the orthographic projection P12 of the frame body 12 on the cover plate 10. That is, the second adhesive layer 14 is covered by the frame body 12 when viewed from the side of the cover plate 10. FIG. 1 schematically illustrates one of the cases where the orthographic projection P14 falls within the orthographic projection P12. In FIG. 1, the edge of the orthographic projection P14 does not exceed the edge of the orthographic projection P12, and the edge of the orthographic projection P14 is aligned with the edge of the orthographic projection P12. However, in another exemplary embodiment, the edge of the orthographic projection P14 may not be aligned with the edge of the orthographic projection P12. For example, the edge of the orthographic projection P14 may be retracted by a distance from the edge of the orthographic projection P12, but not limited thereto.

In the case where the image capturing module is directly adhered to the cover plate through an adhesive layer, the reflectance and/or transmittance in the region where the adhesive layer is provided (for example, above the supporting member) are/is different from that in the region where the adhesive layer is not provided (for example, above the collimator) due to the difference in refractive indices, causing the user to easily perceive the appearance of the image capturing module when operating the biometric identification device.

In contrast, the image capturing module 11 is adhered to the frame body 12 through the second adhesive layer 14, and the second adhesive layer 14 is hidden under the frame body 12, thereby preventing the second adhesive layer 14 from affecting the visual effect. In addition, since the image capturing module 11 is indirectly joined to the cover plate 10 through the second adhesive layer 14, the frame body 12 and the first adhesive layer 13, there may be no need to dispose an adhesive layer between the cover plate 10 and the image capturing module 11. That is, an air gap AG may be present between the cover plate 10 and the image capturing module 11. Since there may be only one light transmission medium (for example, air, that is, an air gap is present between the collimator 113 and the cover plate 10 as well as between the supporting member 114 and the cover plate 10 without filling an adhesive layer) between the cover plate 10 and the image capturing module 11 not covered by the frame body 12 instead of a combination of multiple light transmission media (for example, a combination of air and adhesive layer), the image capturing module 11 is not easily perceived by the user.

According to different needs, the image capturing device 1 may further include other components or film layers. For example, the image capturing device 1 may further include an anti-reflection layer (not shown). The anti-reflection layer may be disposed on the inner surface SI of the cover plate 10 to reduce interface reflection occurred on the inner surface SI.

Figure 2:
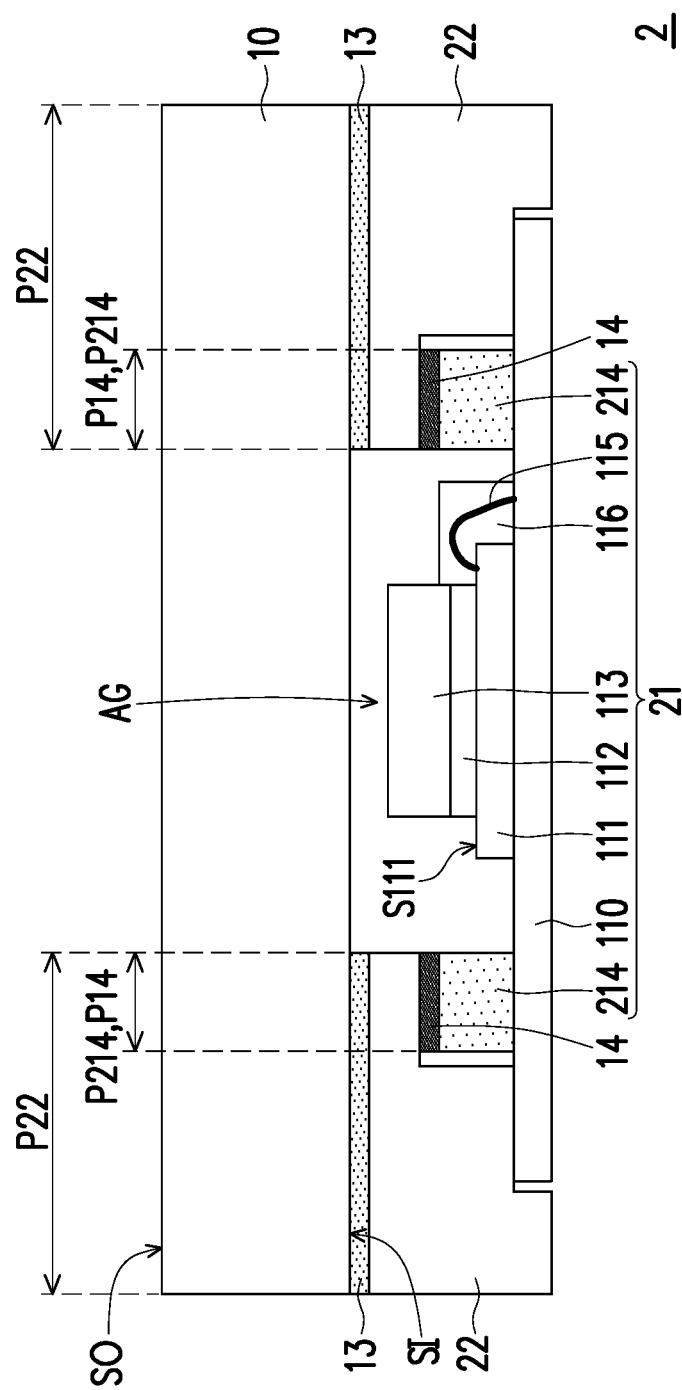

Referring to FIG. 2, the main differences between the image capturing device 2 of the second exemplary embodiment and the image capturing device 1 of FIG. 1 are as follows. In the image capturing device 1, the supporting member 114 and the second adhesive layer 14 are not overlapped, and only the second adhesive layer 14 among the supporting member 114 and the second adhesive layer 14 is hidden under the frame body 12. Specifically, the second adhesive layer 14 is located between the carrier 110 and the frame body 12, and the carrier 110 is joined to the frame body 12 through the second adhesive layer 14. In addition, the supporting member 114 is located between the second adhesive layer 14 and the sensor 111, and an air gap AG is present between the supporting member 114 and the cover plate 10.

On the other hand, in the image capturing device 2, the supporting member 214 is overlapped with the second adhesive layer 14, and the supporting member 214 and the second adhesive layer 14 are both hidden under the frame body 22. Specifically, the supporting member 214 is also located between the carrier 110 and the frame body 22, and the supporting member 214 is joined to the frame body 22 through the second adhesive layer 14. Specifically, the supporting member 214 is located between the carrier 110 and the second adhesive layer 14, and the second adhesive layer 14 is located between the supporting member 214 and the frame body 22. Furthermore, at least a portion of the orthographic projection P214 of the supporting member 214 on the cover plate 10 falls within the orthographic projection P22 of the frame body 22 on the cover plate 10.

By overlapping the supporting member 214 and the second adhesive layer 14, the layout area of the two can be effectively reduced, so that the wiring layout space is more sufficient, and the area of the carrier 110 can be reduced. Accordingly, the overall area of the image capturing module 21 can be further reduced.

Figure 3:
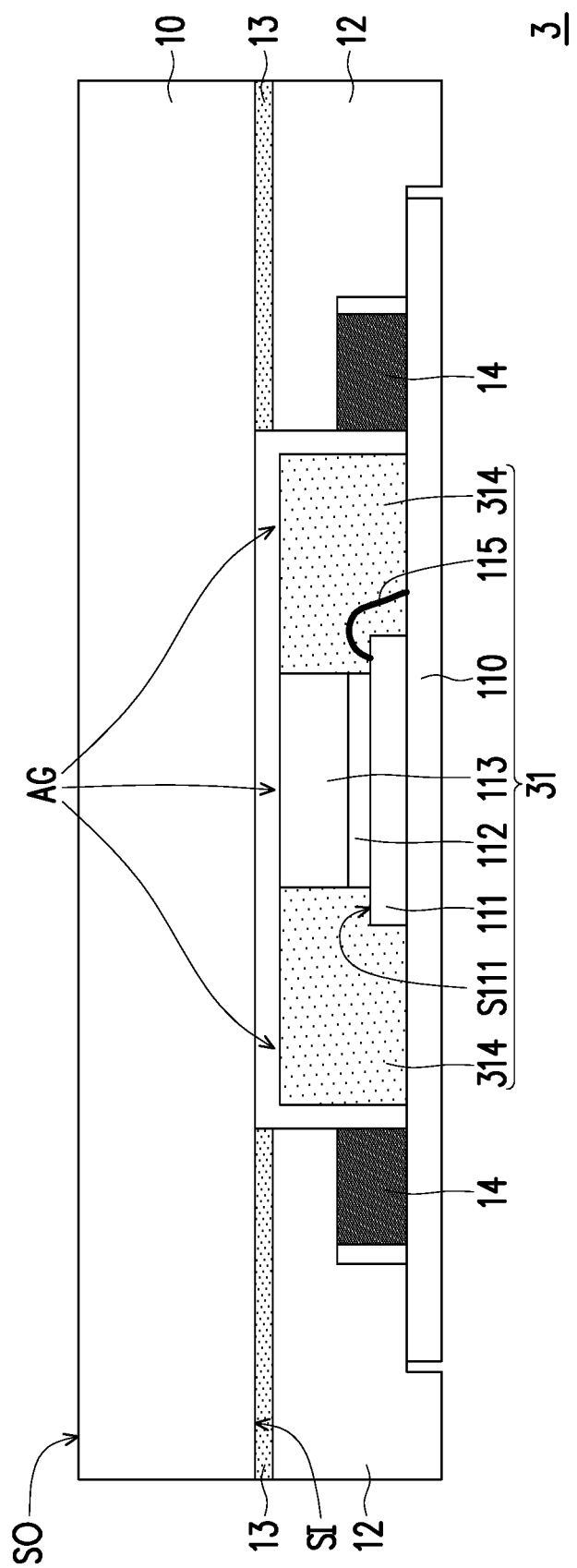

Referring to FIG. 3, the main differences between the image capturing device 3 of the third exemplary embodiment and the image capturing device 1 of FIG. 1 are as follows. In the image capturing device 1, a distance is kept between the supporting member 114 and the sensor 111 (the two are not in contact), and the image capturing module 11 further includes an encapsulation layer 116 to protect the wire 115.

On the other hand, in the image capturing device 3, the supporting member 314 is in contact with the carrier 110, the sensor 111, the band pass filter component 112 and the collimator 113, and the supporting member 314 fixes the sensor 111, the band pass filter component 112 and the collimator 113 on the carrier 110. For example, the supporting member 314 can be formed by curing the encapsulant. Therefore, the image capturing module 31 can omit the encapsulation layer 116 of FIG. 1. The supporting member 314 can be an opaque supporting member, but not limited thereto.

Figure 4:
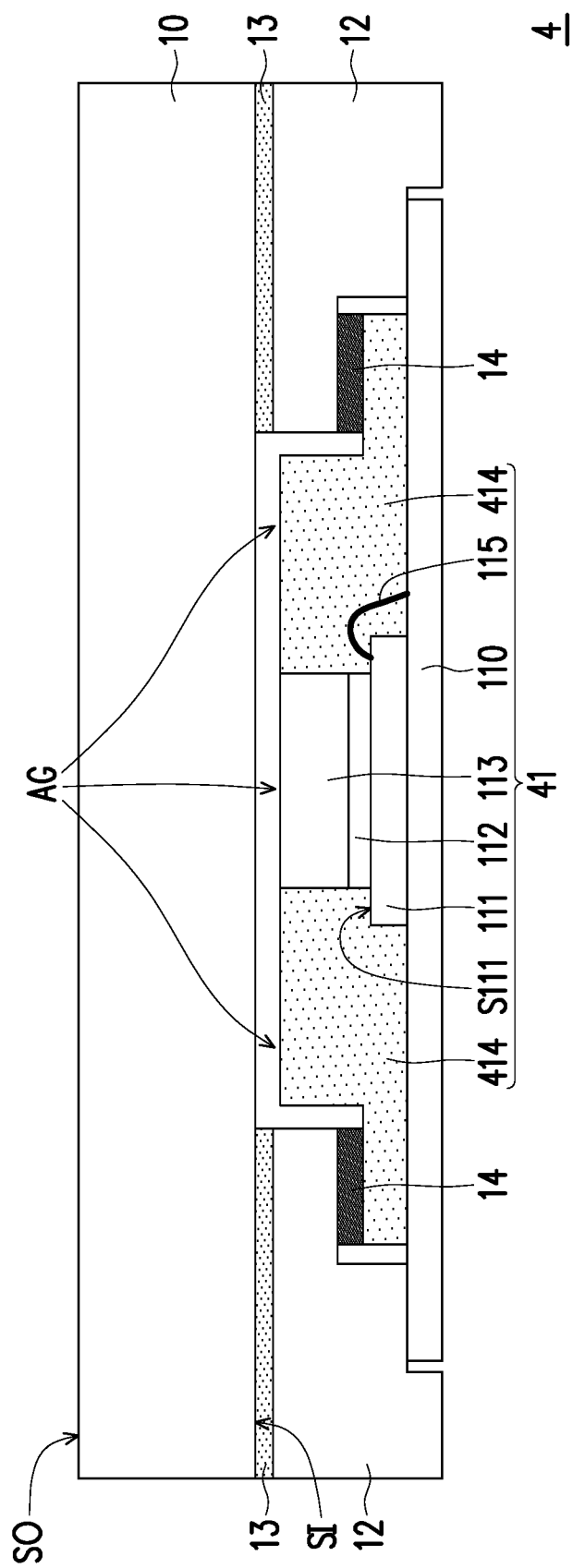

Referring to FIG. 4, the main differences between the image capturing device 4 of the fourth exemplary embodiment and the image capturing device 3 of FIG. 3 are as follows. In the image capturing module 31 of the image capturing device 3, the supporting member 314 does not overlap the frame body 12, and the carrier 110 is joined to the frame body 12 through the second adhesive layer 14.

On the other hand, in the image capturing module 41 of the image capturing device 4, the supporting member 414 further extends below the frame body 12 and is overlapped with the frame body 12. In addition, the supporting member 414 is joined to the frame body 12 through the second adhesive layer 14. The supporting member 414 can be an opaque supporting member, but not limited thereto.

Figure 5:
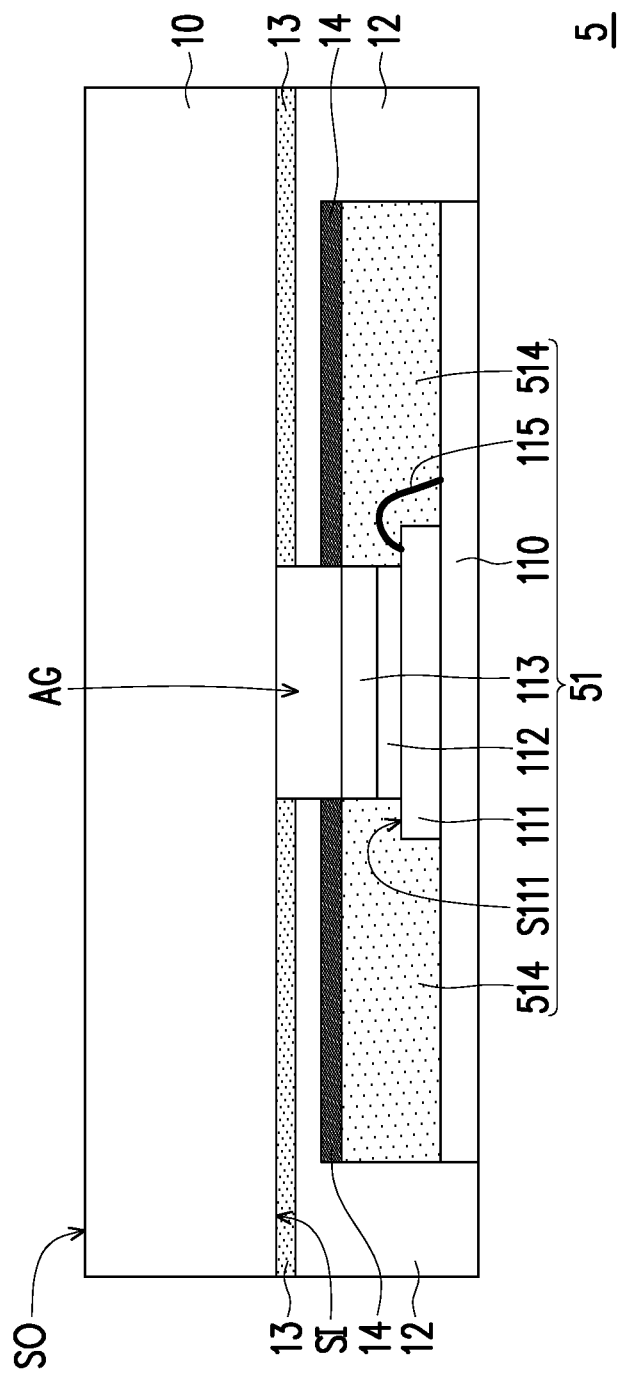

Referring to FIG. 5, the main differences between the image capturing device 5 of the fifth exemplary embodiment and the image capturing device 4 of FIG. 4 are as follows. In the image capturing module 51 of the image capturing device 5, the surface, which is connected to the second adhesive layer 14, of the supporting member 514 is flush with the top surface (the surface that faces the cover plate 10) of the collimator 113. The supporting member 514 can be an opaque supporting member, but not limited thereto. In another exemplary embodiment, the carrier 110 may be joined to the frame body 12 through an adhesive layer or fixing mechanism. Moreover, the supporting member 514 may be joined to the carrier 110 through another adhesive layer or fixing mechanism.

In summary, in the image capturing device of the exemplary embodiments of the disclosure, the frame body is adhered to the cover plate through the first adhesive layer, the image capturing module is adhered to the frame body through the second adhesive layer, and the orthographic projection of the second adhesive layer on the cover plate falls within the orthographic projection of the frame body on the cover plate. Therefore, when viewed from the side of the cover plate, the second adhesive layer is covered by the frame body. By hiding the second adhesive layer under the frame body, it is possible to prevent the second adhesive layer from affecting the visual effect. In addition, since the image capturing module is indirectly joined to the cover plate through the second adhesive layer, the frame body and the first adhesive layer, there is no need to provide an adhesive layer between the cover plate and the image capturing module not covered by the frame body. With such design, there may be only one light transmission medium (such as air) between the cover plate and the image capturing module not covered by the frame body, so the image capturing module is not easily perceived by the user. In an exemplary embodiment, the supporting member of the image capturing module can be overlapped with the second adhesive layer, such that the wiring layout space on the carrier can be more sufficient or the overall area of the image capturing module can be further reduced. In another exemplary embodiment, the supporting member may be formed by curing the encapsulant. In still another exemplary embodiment, the supporting member formed by curing the encapsulant may be overlapped with the second adhesive layer.

Although the disclosure has been disclosed in the above embodiments, it is not intended to limit the disclosure, and those skilled in the art can make some modifications and refinements without departing from the spirit and scope of the disclosure. Therefore, the scope to be protected by the disclosure is subject to the scope defined by the appended claims.

What is claimed is:

1. An image capturing device, comprising:
    a cover plate;
    an image capturing module;
    a frame body, wherein the frame body and the image capturing module are located on the same side of the cover plate;
    a first adhesive layer, wherein the frame body is joined to the cover plate through the first adhesive layer; and
    a second adhesive layer, wherein the image capturing module is joined to the frame body through the second adhesive layer, and an orthographic projection of the second adhesive layer on the cover plate falls within an orthographic projection of the frame body on the cover plate.

2. The image capturing device of claim 1, wherein the cover plate comprises a transparent cover plate, an organic light emitting display panel, a touch panel or a combination of at least two of the above.

3. The image capturing device of claim 1, wherein an air gap is present between the cover plate and the image capturing module.

4. The image capturing device of claim 1, wherein the image capturing module comprises:
    a carrier;
    a sensor, disposed on the carrier;
    a band pass filter component, disposed on the sensor;
    a collimator, disposed on the band pass filter component, and an air gap being present between the collimator and the cover plate; and
    at least one supporting member, disposed on the carrier and located at a periphery of the sensor.

5. The image capturing device of claim 4, wherein the band pass filter component is an infrared filter.

6. The image capturing device of claim 4, wherein the second adhesive layer is located between the carrier and the frame body.

7. The image capturing device of claim 6, wherein the carrier is joined to the frame body through the second adhesive layer, the at least one supporting member is located between the second adhesive layer and the sensor, and an air gap is present between the at least one supporting member and the cover plate.

8. The image capturing device of claim 7, wherein a distance is kept between the at least one supporting member and the sensor.

9. The image capturing device of claim 7, wherein the at least one supporting member is in contact with the carrier, the sensor, the band pass filter component and the collimator, and the at least one supporting member fixes the sensor, the band pass filter component and the collimator on the carrier.

10. The image capturing device of claim 6, wherein the at least one supporting member is located between the carrier and the frame body, the at least one supporting member is joined to the frame body through the second adhesive layer, and at least a portion of an orthographic projection of the at least one supporting member on the cover plate falls within the orthographic projection of the frame body on the cover plate.

11. A fingerprint image capturing device, comprising:
    a cover plate;
    an image capturing module, comprising:
        a carrier;
        a sensor, disposed on the carrier;
        a band pass filter component, disposed on the sensor;
        a collimator, disposed on the band pass filter component; and at least one supporting member, disposed on the carrier and located at a periphery of the sensor;

a frame body, wherein the frame body and the image capturing module are located on the same side of the cover plate;

a first adhesive layer, wherein the frame body is joined to the cover plate through the first adhesive layer; and a second adhesive layer, wherein the image capturing module is joined to the frame body through the second adhesive layer, and an orthographic projection of the second adhesive layer on the cover plate falls within an orthographic projection of the frame body on the cover plate.

12. The fingerprint image capturing device of claim 11, wherein the cover plate comprises a transparent cover plate, an organic light emitting display panel, a touch panel or a combination of at least two of the above.

13. The fingerprint image capturing device of claim 11, wherein an air gap is present between the cover plate and the collimator.

14. The fingerprint image capturing device of claim 11, wherein the band pass filter component is an infrared filter.

15. The fingerprint image capturing device of claim 11, wherein the second adhesive layer is located between the carrier and the frame body.

16. The fingerprint image capturing device of claim 15, wherein the carrier is joined to the frame body through the second adhesive layer, the at least one supporting member is located between the second adhesive layer and the sensor, and an air gap is present between the at least one supporting member and the cover plate.

17. The fingerprint image capturing device of claim 16, wherein a distance is kept between the at least one supporting member and the sensor.

18. The fingerprint image capturing device of claim 16, wherein the at least one supporting member is in contact with the carrier, the sensor, the band pass filter component and the collimator, and the at least one supporting member fixes the sensor, the band pass filter component and the collimator on the carrier.

19. The fingerprint image capturing device of claim 15, wherein the at least one supporting member is located between the carrier and the frame body, the at least one supporting member is joined to the frame body through the second adhesive layer, and at least a portion of an orthographic projection of the at least one supporting member on the cover plate falls within the orthographic projection of the frame body on the cover plate.

* * * * *